(12) United States Patent
Werelius et al.

(10) Patent No.: US 9,110,117 B2
(45) Date of Patent: Aug. 18, 2015

(54) SYSTEM AND METHOD FOR DETECTING VOLTAGE DEPENDENCE IN INSULATION SYSTEMS BASED ON HARMONIC ANALYSIS

(75) Inventors: Nils Peter Werelius, Brottby (SE); Mats Gunnar Ohlen, Stockholm (SE)

(73) Assignee: AVO Multi-Amp Corporation, Dallas, TX (US)

( * ) Notice: Subject to any disclaimer, the term of this patent is extended or adjusted under 35 U.S.C. 154(b) by 1300 days.

(21) Appl. No.: 12/762,114

(22) Filed: Apr. 16, 2010

(65) Prior Publication Data
US 2011/0254564 A1    Oct. 20, 2011

(51) Int. Cl.
*H01H 31/12* (2006.01)
*G01R 27/26* (2006.01)
*G01R 23/20* (2006.01)
*G01R 31/12* (2006.01)

(52) U.S. Cl.
CPC ............ *G01R 27/2617* (2013.01); *G01R 23/20* (2013.01); *G01R 31/12* (2013.01)

(58) Field of Classification Search
None
See application file for complete search history.

(56) References Cited

U.S. PATENT DOCUMENTS

| | | | |
|---|---|---|---|
| 2,298,031 A * | 10/1942 | Bousman | 324/551 |
| 4,447,549 A * | 5/1984 | Masujima et al. | 501/138 |
| 4,541,040 A | 9/1985 | Allfather | |
| 4,757,263 A | 7/1988 | Cummings, III et al. | |
| 4,816,756 A * | 3/1989 | Fox | 324/762.02 |
| 4,975,797 A * | 12/1990 | Veverka et al. | 361/35 |
| 5,541,827 A | 7/1996 | Allfather | |
| 5,818,245 A | 10/1998 | Allfather | |
| 6,340,891 B1 * | 1/2002 | Yagi et al. | 324/551 |
| 6,608,493 B2 | 8/2003 | Hensler et al. | |
| 6,617,859 B1 | 9/2003 | Orton | |
| 6,687,627 B1 * | 2/2004 | Gunn et al. | 702/61 |
| 6,812,716 B2 | 11/2004 | Fawcett | |
| 6,927,562 B2 | 8/2005 | Anand et al. | |
| 6,987,390 B2 | 1/2006 | Suss et al. | |
| 7,079,961 B2 | 7/2006 | Grun | |
| 7,106,078 B1 | 9/2006 | Frank et al. | |
| 7,110,895 B2 * | 9/2006 | Takakamo et al. | 702/57 |
| 7,205,779 B2 | 4/2007 | Jennings | |
| 7,292,048 B2 | 11/2007 | Borsi et al. | |
| 7,342,507 B2 * | 3/2008 | Jonker et al. | 340/870.02 |
| 7,383,140 B2 | 6/2008 | Paz et al. | |
| 7,518,529 B2 * | 4/2009 | O'Sullivan et al. | 340/870.27 |
| 8,125,751 B2 * | 2/2012 | Cavanna et al. | 361/93.2 |

* cited by examiner

*Primary Examiner* — Paresh Patel
(74) *Attorney, Agent, or Firm* — Conley Rose, P.C.; J. Robert Brown, Jr.

(57) ABSTRACT

A method of testing an insulation system is disclosed. The method comprises coupling a first test lead to a first conductor, the first conductor at least partly isolated by the insulation system and coupling a second test lead to a second conductor or a ground. The method further comprises applying a test signal to the first test lead, receiving a test response from the second test lead, and analyzing the test response from the second test lead to determine a harmonic content of the test response. The method further comprises, when the harmonic content is equal to or greater than a predetermined threshold, determining that the insulator system has non-linear properties.

19 Claims, 4 Drawing Sheets

SYSTEM AND METHOD FOR DETECTING VOLTAGE DEPENDENCE IN INSULATION SYSTEMS BASED ON HARMONIC ANALYSIS

CROSS-REFERENCE TO RELATED APPLICATIONS

None.

STATEMENT REGARDING FEDERALLY SPONSORED RESEARCH OR DEVELOPMENT

Not applicable.

REFERENCE TO A MICROFICHE APPENDIX

Not applicable.

BACKGROUND

The electric power system in the United States generates three-phase alternating current (AC) electric power. Each power phase is 120 degrees out of phase, plus or minus, with the other two power phases. The voltage of any phase oscillates sinusoidally between positive voltage and negative voltage. It happens that three-phase electric power generation, transmission, and distribution provides an acceptable compromise between the efficiency, expense, and complexity of power system equipment.

It is more efficient to transmit electric power at high voltage levels than at low voltage levels. Electric power may be generated as three-phase AC power at moderate voltage levels in the 12 thousand volt (kV) to 25 kV range. The voltage level may be stepped up to the 110 kV to 1000 kV range using a transformer for transmission over long transmission lines, hence minimizing transmission line power loss. The transmission line voltage may be stepped down, using a transformer at a substation, to the 12 kV to 35 kV range for local distribution. The local distribution voltage level may be further stepped down through one or more transformer stages to provide 120 volt AC power to the home and office. Special accommodations may be made for manufacturing plant electric power consumers. In some contexts, the electric power system may be abstractly categorized into electric power generation, electric power transmission over extended distances, and electric power distribution to electric power consumers.

The performance of an insulation system in generators, motors, transformers, bushings, and other high-voltage components may change as the insulation deteriorates. This deterioration may lead to a dissipation factor (DF) that is greater than zero. In some contexts, the dissipation factor may be referred to as the insulator power factor. In practical power system components, the dissipation factor is always greater than zero, but by a tolerable fraction of a percent. For example, a dissipation factor value at 20 degrees C. for a new power transformer insulation system may be about 0.002. A dissipation factor value of 0.01 may be grounds for an alert or warning. The external connections to power transformer windings may be provided via bushings. In some embodiments, bushings include ceramic insulators.

Testing of power system transformers may be conducted by connecting a test set to the windings of the power system transformers and exciting the primary winding and the secondary winding with electric signals, both direct current and alternating current. Testing may be conducted on one transformer phase at a time, or may be conducted on multiple transformer phases concurrently. From some points of view, testing electric generators has some similarities to testing transformers. An exciter winding in a generator may be considered to be similar, in some respects, to a transformer winding. The windings of a generator may be considered to be similar, in some respects to a transformer winding. Likewise, from some points of view, testing electric motors may have some similarities to testing transformers and/or testing generators. Transporting the power system transformer, generator, or electric motor to a controlled test laboratory environment may not be economically feasible, and therefore testing typically occurs on site, often outdoors in variable weather conditions. As can readily be appreciated by one skilled in the art, the testing environment associated with high voltage power system transformers, electric generators, and electric motors may be subject to intense electric field fluxes as well as high levels of air borne dust and grit.

SUMMARY

In an embodiment, a method of testing an insulation system is disclosed. The method comprises coupling a first test lead to a first conductor, the first conductor at least partly isolated by the insulation system and coupling a second test lead to a second conductor or a ground. The method further comprises applying a test signal to the first test lead, receiving a test response from the second test lead, and analyzing the test response from the second test lead to determine a harmonic content of the test response. The method further comprises, when the harmonic content is equal to or greater than a predetermined threshold, determining that the insulator system has non-linear properties.

In an embodiment, a test set is disclosed. The test set comprises a stimulator circuit, a detector circuit, and a test controller. The stimulator circuit stimulates an insulation system of an electric apparatus with a test signal. The detector circuit detects a response of the insulation system to the test signal. The test controller determinee a harmonic content of the response, and when the harmonic content is equal to or greater than a predetermined threshold, identifies the insulation system to be non-linear.

In an embodiment, a method of testing an insulation system is disclosed. The method comprises coupling a first test lead to a first conductor, the first conductor at least partly isolated by the insulation system and coupling a second test lead to a second conductor or a ground. The method further comprises applying a test signal to the first test lead and receiving a test response from the second test lead. The method further comprises analyzing the test response from the second test lead to determine a harmonic content of the test response and determining the status of an electric apparatus associated with the insulation system based on the harmonic content of the test response.

These and other features will be more clearly understood from the following detailed description taken in conjunction with the accompanying drawings and claims.

BRIEF DESCRIPTION OF THE DRAWINGS

For a more complete understanding of the present disclosure, reference is now made to the following brief description, taken in connection with the accompanying drawings and detailed description, wherein like reference numerals represent like parts.

DETAILED DESCRIPTION

It should be understood at the outset that although illustrative implementations of one or more embodiments are illustrated below, the disclosed systems and methods may be implemented using any number of techniques, whether currently known or in existence. The disclosure should in no way be limited to the illustrative implementations, drawings, and techniques illustrated below, but may be modified within the scope of the appended claims along with their full scope of equivalents.

The electrical properties of insulation of windings in electric transformers, windings in electric generators, windings in electric motors, of electric bushings, of electric power transport insulators, and of other insulators may be measured to determine a capacitance, a susceptibility, a permittivity, a power factor, a dissipation factor, an inductance, a power loss, and a watts loss of the insulator. The electrical properties of an insulator may not be voltage dependent, in which case the subject insulator may be said to have linear electrical properties. When the electrical properties of the insulator are voltage dependent, that is when the value of one or more electrical property of the insulator measured by a test is different at different test signal voltage levels, the subject insulator may be said to have non-linear electrical properties.

When testing some electric apparatus, for example an electric generator, it may be customary to test an electric insulator of the electric apparatus by stimulating the insulator at a number of different voltage levels, for example stimulating the insulator with a 2 kV test signal, with a 4 kV test signal, with a 6 kV test signal, a 8 kV test signal, and a 10 kV test signal, and measuring one or more electrical characteristics of the insulator at each of these different voltage levels. In some contexts, this test may be referred to as a stepped voltage test and/or as a tip-up test. When the electric insulator has non-linear electrical properties, the measurements may be different at each of the different voltage steps, and the additional data points provide useful insights into the condition and serviceability of the subject electric equipment, for example an electric transformer, an electric generator, an electric motor, a bushing, an insulator, or other electric device. When the electric insulator has linear electrical properties, however, the measurements may not be different, and the time taken to test at each of the different voltage steps is arguably wasted. In the case of an electric insulator having linear electrical properties, a single test at one voltage level is sufficient to measure the electrical properties of the insulator. The present disclosure teaches a system and method of efficiently distinguishing an insulator having linear electrical properties from an insulator having non-linear electrical properties, and when the insulator has non-linear electrical properties, suggesting testing the insulator at multiple voltage levels, for example by a display of a test set suggesting to a technician to test at a plurality of different voltage levels. In an embodiment, the test set may suggest limiting testing of the insulator to testing at a single voltage level when the insulator is determined to have linear electrical properties.

In an embodiment, a test set stimulates an insulator with a test signal and determines the harmonic content and/or harmonic distortion of a response signal in relation to the test signal. When the harmonic content and/or harmonic distortion of the response signal is less than a predetermined threshold, the insulator is determined to have linear electrical properties, and a tip-up test need not be performed on the insulator to determine its electrical properties. For example, the test set may stimulate a primary winding of an electric transformer that has been shorted across its terminals with a test signal at the line frequency of the electric power distribution system and receive a response signal from a ground, a chassis, a case, or a shorted secondary winding. In an embodiment, the harmonic content and/or harmonic distortion value that is calculated may be used to draw conclusions. For example, if the calculated harmonic content and/or harmonic distortion is below a first threshold, the subject electrical device may be returned to normal service; if the calculated harmonic content and/or harmonic distortion value is greater than a second threshold, the subject electrical device may be taken out of service; if the calculated harmonic content and/or harmonic distortion is between the first and second thresholds the subject electrical device may remain in service, but it may be tested more frequently and/or it may be identified for operating at no more than 90% of full rated load or some other diminished fraction of full rated load.

The test set may determine the harmonic content and/or harmonic distortion in a variety of different manners. Different methods of calculating the harmonic content and/or harmonic distortion may be associated with different levels of complexity and different levels of accuracy. In some circumstances, a simplified calculation of harmonic content and/or harmonic distortion may provide sufficient accuracy for the subject usage. In another circumstance, however, a more complicated calculation of harmonic content and/or harmonic distortion may provide greater accuracy that compensates for increased computational complexity.

Figure 1:
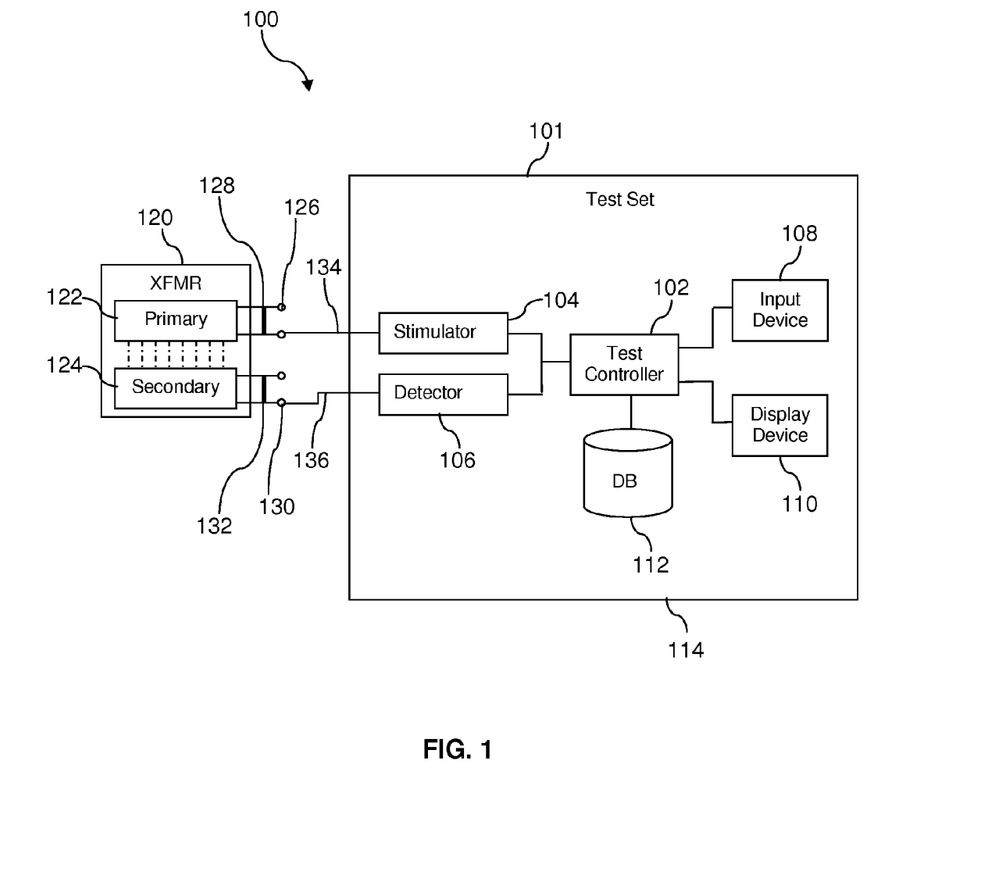
FIG. 1 is a block diagram of a test set according to an embodiment of the disclosure.

Turning now to FIG. 1, a system 100 is described. The system 100 is suitable for testing the electrical characteristics and/or electrical properties of an insulation system, for example an insulation system for a transformer winding. While FIG. 1 illustrates testing an insulator of a primary winding of an electric transformer, it is understood that with appropriate adjustments readily supplied by one skilled in the art the system 100 can be adapted for testing the electrical properties of other insulators. For example, for testing other insulators, a test set 101 may be connected to different test points on the subject insulator and the test set 101 may be configured with different test parameters and/or different predetermined thresholds. The system 100 comprises the test set 101. The test set 101 comprises a test controller 102, a stimulator circuit 104, a detector circuit 106, an input device 108, a display device 110, and an optional database 112. In some embodiments three independent stimulator circuits and three independent detector circuits may be provided, for example for convenience in testing three-phase electric power system components without reconnecting testing lead apparatus. In an embodiment, the test set 101 is enclosed within a case 114 that includes electric shielding.

The test set 101 may be used to test an insulator, for example an insulator of a primary winding 122 of an electric transformer 120. In an embodiment, the insulator may comprise an oil-impregnated cellulose insulation system, for example oil-impregnated pressboard and/or Kraft paper. The insulator may comprise insulator liquid and/or oil, for example mineral oil, ester oil, silicone oil. The insulator may comprise resin impregnated paper, MICAREX, NOMEX, asphalt, resin rich insulation, cross-linked polyethylene (XLPE), ethylene propylene rubber (EPR), porcelain, EPDM rubber, epoxy, SF6, or other known insulator material. In some contexts, the insulator may be referred to as an insulator system. As is known to those skilled in the art, an electrical insulator electrically isolates at least a portion of a conductor from other conductors and/or from ground. For example, a conductor may have one, two, or more terminals that are exposed for connecting to the conductor while the rest of the conductor may be isolated by the insulator system, for example a material that may coat or surround the conductor with the exception of the terminals of the conductor. While ideally an electrical insulator blocks all flow of current between the insulated conductor and other conductors and/or to ground, actual real-world insulators are not ideal and may allow some leakage current between the insulated conductor and other conductors and/or to ground.

The electric transformer 120 may comprise the primary winding 122 and a secondary winding 124. The primary winding 122 may have two or more terminals and/or taps 126 that provide external connections to the primary winding 122. In the test configuration, the terminals 126 of the primary winding 122 may be shorted together by a first link 128. The secondary winding 124 may have two or more terminals and/or taps 130 that provide external connections to the secondary winding 124. In the test configuration, the terminals 130 of the secondary winding 124 may be shorted together by a second link 132. In the test configuration, the stimulator 104 may be coupled to the primary winding 122 using a first test lead 134 and the detector circuit 106 may be coupled to the secondary winding 124 using a second test lead 136. Alternatively, the second test lead 136 may couple the detector circuit 106 to a ground point of the transformer 120 and/or a tank of the transformer 120. In some context the ground point of the transformer 120 may be referred to as a ground lug. When testing other electric components the second test lead 136 may couple the detector circuit 106 to a ground point and/or chassis of a generator, an electric motor, or some other electric component. While in FIG. 1 only one primary winding 122 and one secondary winding 124 of the transformer 120 are illustrated, it is understood that the transformer 120 may have additional pairs of windings. In an embodiment, a test harness comprising two or more pairs of test leads—one pair of test leads per winding pair—may be employed to couple between stimulators and detectors and the electric component under test. In some contexts, electric transformers, electric generators, and electric motors may be referred to as electrical machines. While an electric transformer may not having movable parts, it may nevertheless be considered to be an electrical machine, as having movable parts is not a necessary attribute of a machine.

The stimulator circuit 104 stimulates or excites the insulator under test with a test signal under command from the test controller 102. For example, the stimulator circuit 104 may generate an alternating current (AC) test signal at or near a line frequency to stimulate the primary winding 122 or other electric component. Line frequency is the fundamental frequency of a power distribution system. In many parts of the United States, the line frequency may be about 60 Hz. In many parts of Europe, the line frequency may be about 50 Hz. Other line frequencies are known. For example, a 16⅔ Hz line frequency is used in Germany, Austria, Switzerland, Sweden, and Norway for traction power networks for railways. A 25 Hz line frequency is used for some railway systems in Austria, New York, and Pennsylvania. A 400 Hz line frequency may be used in some aircraft electric power applications. The present disclosure contemplates applying the present teachings to any line frequency. Alternatively, in an embodiment, the stimulator circuit 104 may generate the AC test signal at a frequency that is different from the line frequency.

The stimulator circuit 104 may generate the AC test signal at a desired voltage and current level. For example, in different embodiments, a test signal may be generated having a RMS voltage (Vrms) in the range from about 10 Vrms to about 10,000 Vrms. Those of skill in the art will appreciate that for testing the insulation system of different electric apparatus, different ranges of RMS test voltages may apply. In an embodiment, it is understood that the test signal may be maintained at substantially a single RMS voltage value throughout the test, for example under the condition that the electrical characteristics of the insulator under test are determined to be linear based on the novel method taught by the present disclosure. The test controller 102 may transmit both the frequency and the RMS voltage value to the stimulator circuit 104 to determine the AC test signal generated by the stimulator circuit 104.

In an embodiment, the detector circuit 106 receives a test response from the second test lead 136, converts this test response into a digital value, and transmits the digitized value of the test response to the test controller 102. The digital value may comprise one or more time sequences of digitized values of the test response, leaving to the test controller 102 the responsibility for analyzing the time sequences of digitized values to determine frequency values, phase offsets, amplitudes, etc. The digitized values may comprise a time sequence of measured voltage values and/or a time sequence of measured current values. Alternatively, in an embodiment, the detector circuit 106 may analyze the test response to determine a frequency content of the test response and convey the results of the analysis to the test controller 102.

In an embodiment, the test controller 102 analyzes the test response to determine if the electrical characteristics of the insulator under test are linear. To make this determination, in an embodiment the test controller 102 analyzes the harmonic distortion in the test response in relation to the harmonic content of the test signal. The harmonic distortion may be calculated as the ratio of a sum of the test response components at frequencies that are a harmonic frequency of the test frequency, for example the line frequency, to the test response component at the test frequency. A variety of different methods of calculating the harmonic distortion of a signal are known to those of skill in the art, and all of these methods are contemplated by the present disclosure. While one equation is provided below, it is understood that using other methods and formulations to calculate the harmonic distortion of the test response are equally suitable for use in implementing the test set of the present disclosure.

In one embodiment the harmonic distortion (HD) of the test response may be calculated as $$HD = \frac{\sum_{f=2}^{n} I_f}{I_1} \quad \text{(EQ 1)}$$

In EQ 1, $I_1$ is the electric current of the test response at the fundamental frequency of the test signal, which may also be referred to as the fundamental frequency. Also in EQ 1, $I_2$ is the electric current of the test response in the first harmonic of the fundamental frequency, $I_3$ is the electric current of the test response in the second harmonic of the fundamental frequency, and $I_n$ is the electric current of the test response in the (n-1)-th harmonic of the fundamental frequency. The first harmonic frequency is a frequency that is twice the fundamental frequency. The second harmonic frequency is three times the fundamental frequency. The (n-1)-th harmonic frequency is a frequency that is n times the fundamental frequency.

The number of different harmonics to be analyzed to determine the harmonic distortion can be determined by one skilled in the art to achieve a suitable balance between precision and processing complexity. In an embodiment, only the first two harmonics or only the first three harmonics may be analyzed. Alternatively, in other cases, additional harmonics may be analyzed to determine the harmonic distortion in the test response to a higher precision. Generally it is typical that the energy in the harmonics decrease at each step up in harmonic frequency. For example, the third harmonic would generally be expected to have less energy than the second harmonic, and the fourth harmonic would generally be expected to have less energy than the third harmonic. In some cases this decreasing relationship between harmonics may not hold. The harmonic distortion may be considered to be a measure or indication of harmonic content. Harmonic content may be calculated separately as the sum of electric current in the test response at several harmonic frequencies.

In an alternative embodiment, the HD of the test response may be calculated as $$HD = \frac{I_a}{I_1} \quad (EQ\ 2)$$

where $I_1$ is the electric current of the test response at the fundamental frequency of the test signal and $I_a$ is the electric current of test response at an arbitrary harmonic of the fundamental frequency. In alternative embodiment, the HD of the test response may be calculated as $$HD = \frac{I_a + I_b}{I_1} \quad (EQ\ 3)$$

where $I_1$ is the electric current of the test response at the fundamental frequency of the test signal, $I_a$ is the electric current of test response at a first arbitrary harmonic of the fundamental frequency, and $I_b$ is the electric current of the test response at a second arbitrary harmonic of the fundamental frequency different from the frequency of $I_a$. In an alternative embodiment, the HD of the test response may be calculated as $$HD = \frac{I_a + I_b + I_c}{I_1} \quad (EQ\ 4)$$

where $I_1$ is the electric current of the test response at the fundamental frequency of the test signal, $I_a$ is the electric current of test response at a first arbitrary harmonic of the fundamental frequency, $I_b$ is the electric current of the test response at a second arbitrary harmonic of the fundamental frequency, and $I_c$ is the electric current of the test response at a third arbitrary harmonic of the fundamental frequency different from the frequencies of $I_a$ and $I_b$. Generally, HD can be calculated as the sum of any selection of electric currents of the test response at different arbitrary harmonics of the fundamental frequency divided by the electric current of the test response at the fundamental frequency of the test signal. In an embodiment, the harmonic content (HC) may be considered without reference to the electric current of the test response at the fundamental frequency, that is the harmonic content may be determined as the numerator in any of EQ 1, EQ 2, EQ 3, or EQ 4 above or as the sum of an arbitrary selection of electric current harmonics without reference to the electric current of the test response at the fundamental frequency.

In some cases, the test signal may contain harmonic components which cause corresponding harmonic components of the electric current in the test response. For a more accurate determination of harmonic distortion and/or harmonic content, these harmonic components of the electric current in the test response due to harmonic components in the test signal may be calculated and subtracted from the corresponding electric current harmonics of the test response before determining the harmonic distortion and/or harmonic content. This may referred to as a compensated harmonic distortion and/or a compensated harmonic content. In some circumstances the additional calculation complexity involved in determining the compensated harmonic distortion and/or compensated harmonic content may be unnecessary to achieving the practical goals of testing. It is a design choice or implementation decision whether this additional complexity is justified by the associated increased accuracy. The present disclosure contemplates determining harmonic distortion and/or harmonic content by either the compensated or an uncompensated approach.

When the harmonic distortion determined as describe above is less than a predetermined threshold, the insulator under test may be deemed to have linear electrical characteristics. In an embodiment, the predetermined threshold may be less than about 1 percent. In an embodiment, the predetermined threshold may be less than about 0.5 percent. In an embodiment, the predetermined threshold may be less than about 0.2 percent. In another embodiment, other predetermined thresholds may be employed.

In an embodiment, the predetermined threshold may be configured using the input device 108 at the time of configuring the test procedure. Testing the electrical characteristics of insulators of different electric components may be associated with different predetermined thresholds for the harmonic distortion. Alternatively, different organizations or businesses may define different predetermined thresholds for the same equipment. For example, company X may prefer testing using a predetermined threshold of about 0.8 percent while company Y may prefer testing using a predetermined threshold of about 1 percent.

When the insulator under test is deemed to have linear electrical characteristics, the subject insulator may be tested at a single voltage level. For example, an insulator on the primary winding 122 that is deemed to have linear electrical characteristics may be tested at a single 10,000 Vrms voltage level to determine the values of its electrical characteristics. On the other hand, when the insulator under test is deemed to have non-linear electrical characteristics, the subject insulator may be tested at a plurality of voltages. For example, the insulator on the primary winding 122 that is deemed to have non-linear electrical characteristics may be tested at a 2,000 Vrms voltage level, a 4,000 Vrms voltage level, a 6,000 Vrms voltage level, a 8,000 Vrms voltage level, and a 10,000 Vrms voltage level, and the values of its electrical characteristics determined at each of these voltage levels.

The electrical characteristics may be determined by the test controller 102 comparing the test response to the test signal. The electrical characteristics determined may be one or more of a capacitance, a power factor, a dissipation factor, a permittivity, a susceptibility, and/or other electrical characteristics. The electrical characteristics of insulators may change over time and diverge more and more from the values that might be assumed for perfect and/or ideal insulators. The dissipation factor (DF) and/or insulator power factor of an electric component is a measure of insulator loss-rate of power. In some contexts the insulator power factor may be referred to as the dissipation factor of the insulator of an electric component. The electric power lost in an electric component is primarily lost in the form of heat. It is desirable to keep insulator power factor at a low level to avoid excessive heat in the electric components which may prematurely degrade and/or destroy the electric components. In extreme cases, excessively high insulator power factor may cause thermal runaway. The dissipation factor may be determined as the loss tangent as the ratio of the resistance to the reactance of the electric component:

$$\tan \delta = \text{dissipation factor} = R/X$$

where R represents resistance and X represents the reactance of the power system component. The related insulator power factor may be determined as the ratio of the resistance to the amplitude of the impedance of the power system component:

$$\text{insulator power factor} = R/\{SQRT(SQR(R)+SQR(X))\}$$

It can readily be appreciated that for small values of dissipation factor, the dissipation factor is approximately equivalent to the insulator power factor. Insulator power factor may change with the temperature of the electric component, typically increasing at higher temperatures. Additionally, insulator power factor may change with aging of the electric component, for example as insulator materials degrade over time, typically increasing with age. The insulator power factor may change as a result of excessive moisture, for example a moisture content in a bushing or a moisture content in insulator of a transformer winding. When an electric component is new, the insulator power factor typically does not change significantly with increased temperatures. With increased age, however, the insulator power factor often changes more with increased temperature.

The test controller 102 may access the test results database 112 to store results of testing and to read test results from earlier tests. The input device 108 may be a keyboard and/or keypad and/or touchscreen. The input device 108 may also comprise one or more switches and/or pushbuttons. The display device 110 may be a flat panel display, a liquid crystal display (LCD), or other display. The case 114 may be a ruggedized plastic case that is designed to absorb and dampen mechanical disturbances, for example bumps or jars from metal tools or falls onto concrete. In an embodiment, the case 114 includes electric shielding to protect the components of the test set 101 from the strong electromagnetic fields and/or electric fields that may be experienced at electric power system locations, for example at electric power generating stations and/or electric power distribution stations. In an embodiment, the case 114 is designed to contain the harness 122 when closed.

The test set 101 may be coupled to local AC power, for example about 120 VAC power or about 230 VAC power. The test set 101 may be coupled to a printer at the test location, in the field, to print out test results on location, while the test set 101 remains coupled to the electric component under test.

It will be appreciated by one skilled in the art that the test set 101 may readily be employed for testing electric apparatus other than power system transformers, including instrument transformers, cables, generators, motors, rotating machines, bushings, cables, batteries, protection relays, circuit breakers, and others, in some cases after making appropriate modifications to the stimulator circuit 104 or detector circuit 106 or test controller 102. Additionally, while the insulation testing functionality of the test set 101 was described above, in an embodiment the test set 101 may be multi-functional and may provide other test functions, such as transformer winding counting, transformer turns ratio determination, transformer winding resistance determination, motor winding counting, motor winding resistance determination, and other testing functions.

Figure 2:
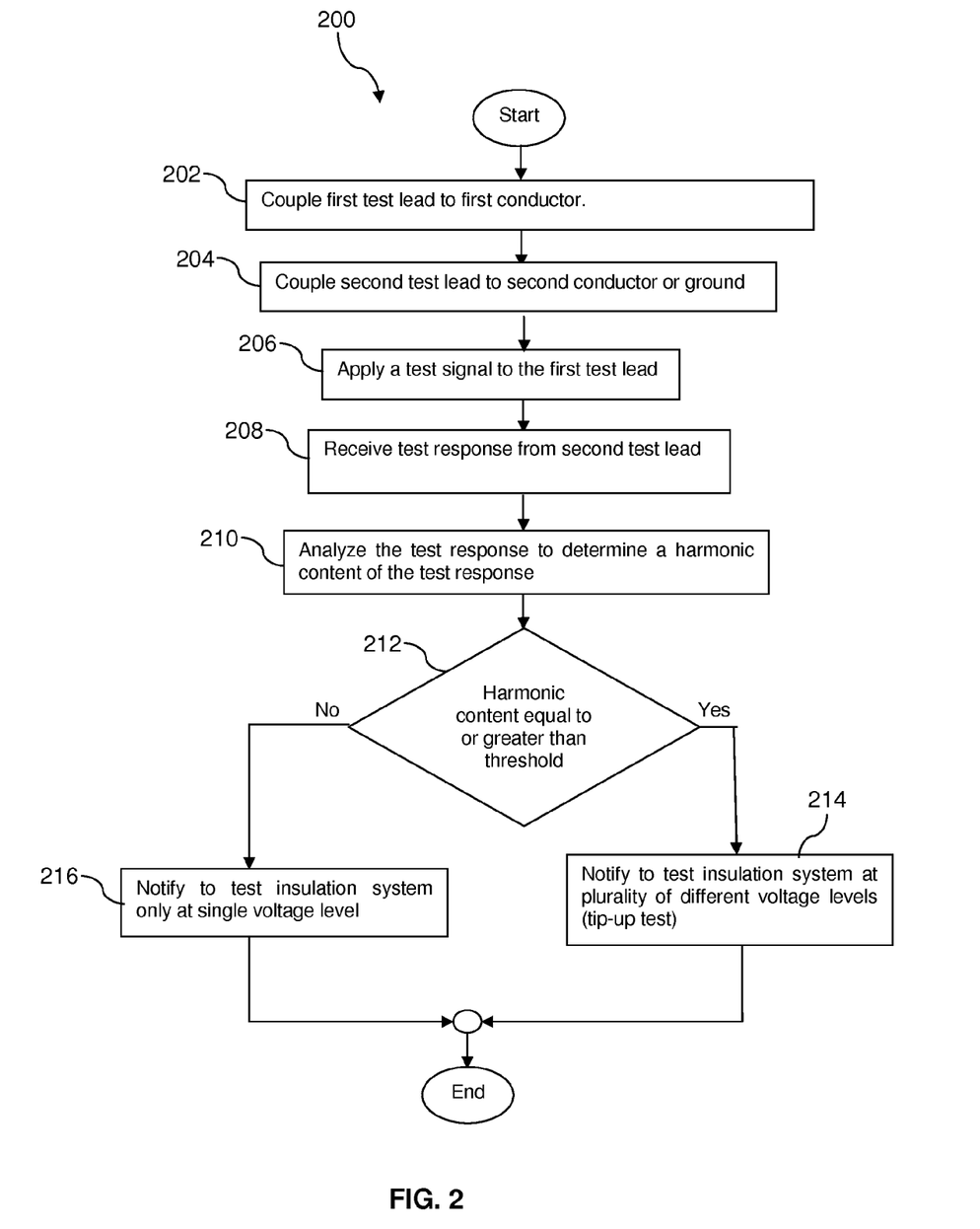
FIG. 2 is a flow diagram of a method of testing according to an embodiment of the disclosure.

Turning now to FIG. 2, a method 200 of testing an insulation system is described. At block 202, the first test lead 134 is coupled to a first conductor, for example to the terminals 126 of the primary winding 122 of an electrical machine such as an electric transformer, an electric generator, or an electric motor. In some contexts, electric transformers, electric generators, and electric motors may be referred to as electrical machines. In an embodiment, the terminals 126 of the primary winding 122 may be shorted together. It is understood that block 202 may likewise apply to coupling the first test lead 134 to another electric component when testing other electric devices. At block 204, the second test lead 136 is coupled to one of a second conductor or to a ground, for example the terminals 130 of the secondary winding 124 of an electrical machine. In an embodiment, the terminals 130 of the secondary winding 124 may be shorted together. Alternatively, the second test lead 136 may be coupled to a ground point, a chassis, and/or a tank of the electrical machine. One or more configuration parameters for the test of the subject electric component, for example the insulator of the primary winding 122, may be entered into the input device 108. One of these configuration parameters may include the predetermined threshold of harmonic content and/or harmonic distortion of the test response.

At block 206, a test signal is applied to the first test lead 134. For example, the stimulator circuit 104 generates a test signal based on commands received from the test controller 102 and transmits this test signal via the first test lead 134. At block 208, a test response is received by the second test lead 136. For example, the detector circuit 106 receives the test response via the second test lead 136 and captures the test response. The detector circuit 106 may measure and/or sense the voltage and/or current values of the test response and digitize these values into a time-sequence of digital values representing the measured and/or sensed voltage and/or current values. Alternatively, the detector circuit 106 may measure and/or sense only one of voltage and current values of the test response and digitize those values into a time-sequence of digital values representing the measured one of voltage or current values. The detector circuit 106 may transmit the test response to the test controller 102 to be analyzed. The detector circuit 106 may transmit the test response encoded as a time-sequence of digital values.

At block 210, the test controller 102 analyzes the test response to determine a harmonic content and/or harmonic distortion of the test response. The test controller 102 may determine the harmonic distortion substantially based on EQ 1, EQ 2, EQ 3, or EQ 4 as described above or according to some other method of determining harmonic distortion and/or total harmonic content.

At block 212, if the harmonic content of the test response is equal to or greater than the predetermined threshold, the processing proceeds to block 214. At block 214, the test operator may be notified to test the insulation system at a plurality of different voltage levels or to perform a tip-up test. In an embodiment, after the processing illustrated in block 214, the test set 101 may automatically perform a tip-up test of the insulation system in this circumstance, determine results of the tip-up test, store the results in the database 112, and display the results. If the harmonic content is less than the predetermined threshold, the processing proceeds to block 216 and the test operator may be notified to test the insulation system only at a single voltage level. In an embodiment, after the processing illustrated in block 216, the test set 101 may automatically perform a test of the insulation system at a single voltage, determine the results of the test, store the results in the database 112, and display the results. Alternatively, after the processing of block 216, the test controller 102 may analyze the test result captured at block 208 to determine the electrical characteristics and/or electrical properties of the insulation system. It is understood that the method 200 may be employed to test insulators other than the insulator of a primary winding of a transformer, a generator, or an electric motor with suitable adaptations readily supplied by one of ordinary skill in the art.

At block 212, if the harmonic distortion is equal to or greater than the predetermined threshold, the processing proceeds to block 216. At block 216, the insulator of the primary winding 122 is tested at a plurality of different voltage levels, which may be referred to in some contexts as a tip-up test. The desired electrical characteristics and/or electrical properties of the insulator are determined by the test controller 102 at each of the different voltage levels. The calculated electrical characteristics and/or electrical properties of the insulator may be stored by the test controller 102 in the database 112, displayed on the display device 110, and possibly printed out on a printer. The method 200 then exits.

Figure 3:
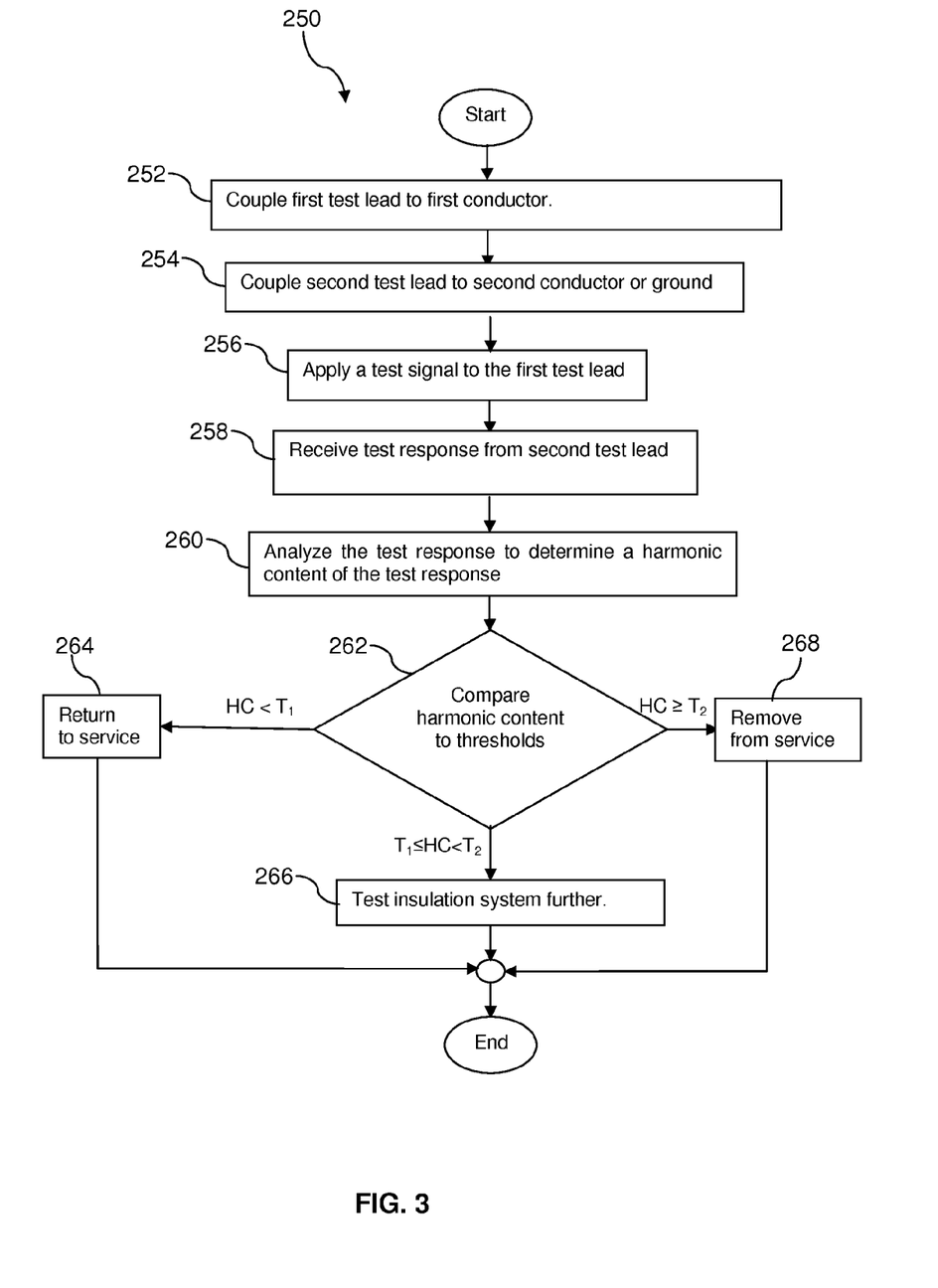
FIG. 3 is a flow diagram of a method of testing according to an embodiment of the disclosure.

Turning now to FIG. 3, a method 250 is described. The processing of blocks 252 to 260 are substantially similar to the processing of blocks 202 through 210 described with reference to FIG. 2 and method 200 above. Based on the determined harmonic content in the test response, a status of the subject electric apparatus associated with the insulation system is determined. For example, the electric apparatus may be determined to be in good or OK status and returned to status. Alternatively, the electric apparatus may be determined to be in unserviceable condition such that the electric apparatus should not be returned to service in its current status, needing to be repaired, refurbished, or decommissioned. In an embodiment, at block 262, the harmonic content is compared to two thresholds, a first threshold $T_1$ and a second threshold $T_2$. If the harmonic content is less than the first threshold, the processing proceeds to block 264 where the electric apparatus associated with the insulation system tested is deemed serviceable and may be returned to service. If the harmonic content is equal to or greater than the first threshold but less than the second threshold, the processing proceeds to block 266 where the insulation system may be tested further. The electrical apparatus associated with the insulation system may be returned to service, but further tests may be recommended to determine whether to operate the electrical apparatus at less than full rated capacity or to determine a scheduled decommissioning date for the electrical apparatus. If the harmonic content is equal to or greater than the second threshold, the processing proceeds to block 268 where it is recommended that the electric apparatus be removed from service and/or not be returned to service. The method 250 then exits.

Figure 4:
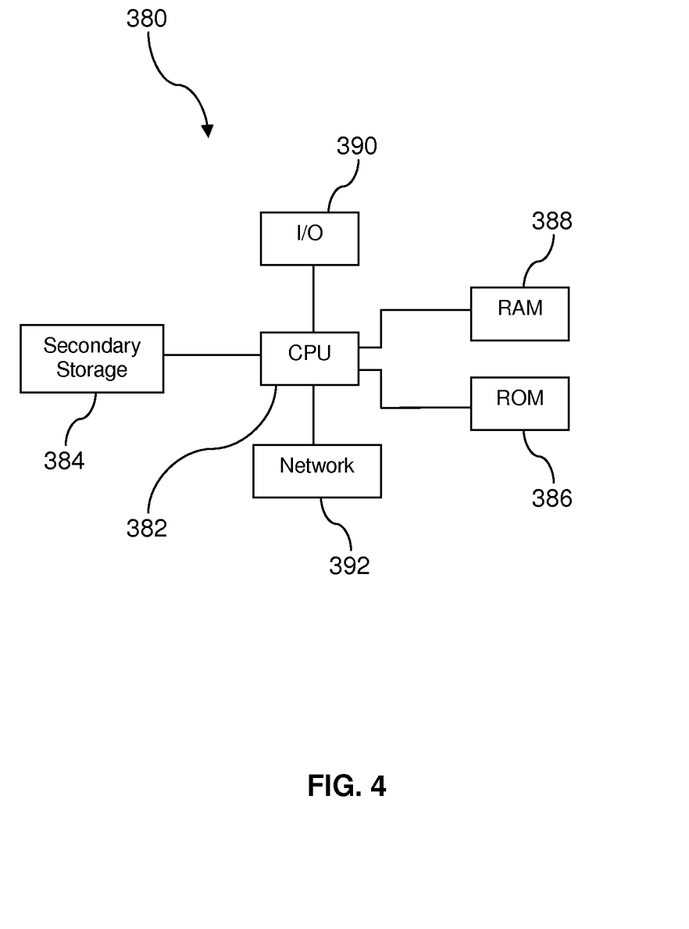
FIG. 4 is an illustration of a computer system suitable for implementing at least portions of the several embodiments of the disclosure.

Turning now to FIG. 4, a computer system 380 is now discussed. Portions of the test set 101 described above may be implemented using the computer 380 with sufficient processing power, memory resources, and network throughput capability to handle the necessary workload placed upon it and with appropriate mechanical and electric shielding to protect the general-purpose computer from the harsh environment of the power system field environment. The computer system 380 includes a processor 382 (which may be referred to as a central processor unit or CPU) that is in communication with memory devices including secondary storage 384, read only memory (ROM) 386, random access memory (RAM) 388, input/output (I/O) devices 390, and network connectivity devices 392. The processor may be implemented as one or more CPU chips.

The secondary storage 384 is typically comprised of one or more disk drives or tape drives and is used for non-volatile storage of data and as an over-flow data storage device if RAM 388 is not large enough to hold all working data. Secondary storage 384 may be used to store programs which are loaded into RAM 388 when such programs are selected for execution. The ROM 386 is used to store instructions and perhaps data which are read during program execution. ROM 386 is a non-volatile memory device which typically has a small memory capacity relative to the larger memory capacity of secondary storage. The RAM 388 is used to store volatile data and perhaps to store instructions. Access to both ROM 386 and RAM 388 is typically faster than to secondary storage 384.

I/O devices 390 may include printers, video monitors, liquid crystal displays (LCDs), touch screen displays, keyboards, keypads, switches, dials, mice, track balls, voice recognizers, card readers, paper tape readers, or other well-known input devices.

The network connectivity devices 392 may take the form of modems, modem banks, Ethernet cards, universal serial bus (USB) interface cards, serial interfaces, token ring cards, fiber distributed data interface (FDDI) cards, wireless local area network (WLAN) cards, radio transceiver cards such as code division multiple access (CDMA), global system for mobile communications (GSM), worldwide interoperability for microwave access (WiMAX), and/or industrial, scientific, medical (ISM) band radio transceiver cards, and other well-known network devices. These network connectivity devices 392 may enable the processor 382 to communicate with an Internet or one or more intranets. With such a network connection, it is contemplated that the processor 382 might receive information from the network, or might output information to the network in the course of performing the above-described method steps. Such information, which is often represented as a sequence of instructions to be executed using processor 382, may be received from and outputted to the network, for example, in the form of a computer data signal embodied in a carrier wave Such information, which may include data or instructions to be executed using processor 382 for example, may be received from and outputted to the network, for example, in the form of a computer data baseband signal or signal embodied in a carrier wave. The baseband signal or signal embodied in the carrier wave generated by the network connectivity devices 392 may propagate in or on the surface of electric conductors, in coaxial cables, in waveguides, in optical media, for example optical fiber, or in the air or free space. The information contained in the baseband signal or signal embedded in the carrier wave may be ordered according to different sequences, as may be desirable for either processing or generating the information or transmitting or receiving the information. The baseband signal or signal embedded in the carrier wave, or other types of signals currently used or hereafter developed, referred to herein as the transmission medium, may be generated according to several methods well known to one skilled in the art.

The processor 382 executes instructions, codes, computer programs, scripts which it accesses from hard disk, floppy disk, optical disk (these various disk based systems may all be considered secondary storage 384), ROM 386, RAM 388, or the network connectivity devices 392. While only one processor 392 is shown, multiple processors may be present. Thus, while instructions may be discussed as executed by a processor, the instructions may be executed simultaneously, serially, or otherwise executed by one or multiple processors.

While several embodiments have been provided in the present disclosure, it should be understood that the disclosed systems and methods may be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted or not implemented.

Also, techniques, systems, subsystems, and methods described and illustrated in the various embodiments as discrete or separate may be combined or integrated with other systems, modules, techniques, or methods without departing from the scope of the present disclosure. Other items shown or discussed as directly coupled or communicating with each other may be indirectly coupled or communicating through some interface, device, or intermediate component, whether electrically, mechanically, or otherwise. Other examples of changes, substitutions, and alterations are ascertainable by one skilled in the art and could be made without departing from the spirit and scope disclosed herein.

What is claimed is:

1. A method of testing an insulation system, comprising:
coupling a first test lead to a first conductor, the first conductor at least partly isolated by the insulation system;
coupling a second test lead to a second conductor or a ground;
applying a test signal to the first test lead;
receiving a test response from the second test lead;
analyzing the test response from the second test lead to determine a harmonic content of the test response; and
when the harmonic content is equal to or greater than a predetermined threshold, determining that the insulator system has non-linear properties.

2. The method of claim 1, further comprising, when the insulator system is determined to have non-linear properties, testing the insulator system at a plurality of voltage levels.

3. The method of claim 1, wherein analyzing the test response comprises comparing the harmonic content of the test response to a fundamental frequency content of the test response and wherein the insulator system is determined to have non-linear properties when the ratio of the harmonic content of the test response to the fundamental frequency content of the test response is equal to or greater than the predetermined threshold.

4. The method of claim 1, wherein the first conductor is associated with an electric apparatus that is one of an electric transformer, an electric generator, an electric motor, an electric bushing, and an electric cable.

5. The method of claim 1, wherein when the harmonic content is less than the predetermined threshold, identifying the electrical characteristic of the insulation system to be linear, and when the electrical characteristic of the insulation system is identified to be linear, testing the insulation system at a only a single voltage level.

6. The method of claim 1, further comprising shorting together two terminals of the first conductor.

7. The method of claim 1, wherein the second test lead is coupled to at least one of a ground of an electric apparatus, a chassis of the electric apparatus, and a tank of the electric apparatus.

8. The method of claim 1, wherein testing the insulation system comprises determining at least one of a capacitance, a power factor, a dissipation factor, a permittivity, a susceptibility, an inductance, a power loss, and a watts loss of the insulation system.

9. A test set, comprising:
a stimulator circuit to stimulate an insulation system of an electric apparatus with a test signal;
a detector circuit to detect a response of the insulation system to the test signal; and
a test controller to determine a harmonic content of the response, and when the harmonic content is equal to or greater than a predetermined threshold, to identify the insulation system to be non-linear,
wherein when the harmonic content is less than the predetermined threshold, the test controller identifies the insulation system to be liner and tests the insulation system at a single voltage level.

10. The test set of claim 9, wherein when the insulation system is determined to be non-linear, presenting a suggestion to test the insulation system at a plurality of voltage levels.

11. The test set of claim 9, wherein when the insulation system is determined to be non-linear, the test controller tests the insulation system at a plurality of voltage levels.

12. The test set of claim 9, wherein the electrical apparatus is one of an electric transformer, an electric cable, an electric bushing, an electric generator, and an electric motor.

13. A method of testing an insulation system, comprising:
coupling a first test lead to a first conductor, the first conductor at least partly isolated by the insulation system;
coupling a second test lead to a second conductor or a ground;
applying a test signal to the first test lead;
receiving a test response from the second test lead;
analyzing the test response from the second test lead to determine a harmonic content of the test response; and
determining the status of an electric apparatus associated with the insulation system based on the harmonic content of the test response.

14. The method of claim 13, wherein a harmonic distortion of the test response is determined based on a ratio of a sum of harmonic currents in the second test lead to a fundamental current in the second test lead and wherein determining the status of the electric apparatus is based on the harmonic distortion.

15. The method of claim 14, wherein the harmonic distortion is determined based on cancelling the harmonic currents in the second test lead that are caused by harmonic voltage of the test signal.

16. The method of claim 13, wherein when the harmonic content is equal to or greater than the first threshold and less than the second threshold, the insulation system is tested at a plurality of different voltage levels.

17. The method of claim 13, further comprising, when the harmonic content is less than a first threshold, determining that an electric apparatus associated with the insulation system content can be returned to service.

18. The method of claim 13, further comprising, when the harmonic content is equal to or greater than a second threshold, determining that the electrical apparatus should not be returned to service.

19. The method of claim 13, further comprising, when the harmonic content is equal to or greater than a first threshold and less than a second threshold, determining that a condition of the electrical apparatus should be further investigated.

* * * * *